(12) United States Patent
Hsu et al.

(10) Patent No.: US 8,590,389 B2
(45) Date of Patent: Nov. 26, 2013

(54) MEMS PRESSURE SENSOR DEVICE AND MANUFACTURING METHOD THEREOF

(75) Inventors: Chin-Fu Hsu, Hsinchu (TW); Chia-Hsing Shih, Hsinchu (TW)

(73) Assignee: Metrodyne Microsystems Corporation, R.O.C., Hsinchu (TW)

( * ) Notice: Subject to any disclaimer, the term of this patent is extended or adjusted under 35 U.S.C. 154(b) by 168 days.

(21) Appl. No.: 13/370,758

(22) Filed: Feb. 10, 2012

(65) Prior Publication Data

US 2013/0205908 A1    Aug. 15, 2013

(51) Int. Cl.
*G01L 9/02* (2006.01)
*H01L 21/58* (2006.01)

(52) U.S. Cl.
USPC ............................... 73/754; 438/53; 257/419

(58) Field of Classification Search
None
See application file for complete search history.

(56) References Cited

U.S. PATENT DOCUMENTS

| 6,093,579 A | 7/2000 | Sathe | |
|---|---|---|---|
| 8,511,171 B2 * | 8/2013 | Gamage et al. | 73/754 |
| 2005/0076719 A1 * | 4/2005 | Jakobsen et al. | 73/718 |
| 2013/0087865 A1 * | 4/2013 | Ten Have | 257/419 |

* cited by examiner

*Primary Examiner* — Andre Allen
(74) *Attorney, Agent, or Firm* — Tung & Associates

(57) ABSTRACT

The present invention discloses a Micro-Electro-Mechanical System (MEMS) pressure sensor device and a manufacturing method thereof. The MEMS pressure sensor device includes: a substrate having at least one recess formed on an upper surface thereof, the recess defining a boss; a membrane, which is bonded to at least a part of the upper surface and at least a part of the boss, so that the at least one recess forms a cavity; at least one sensing unit, which is coupled to the membrane, for sensing deflection of the membrane; and an opening, which is formed on a lower surface of the substrate, and connects to the cavity.

14 Claims, 5 Drawing Sheets

MEMS PRESSURE SENSOR DEVICE AND MANUFACTURING METHOD THEREOF

BACKGROUND OF THE INVENTION

1. Field of Invention

The present invention relates to a Micro-Electro-Mechanical System (MEMS) pressure sensor device and a manufacturing method thereof; particularly, it relates to such MEMS pressure sensor device and manufacturing method capable of sensing a lower pressure.

2. Description of Related Art

FIGS. 1A-1E show cross-section views of a manufacturing flow of a MEMS pressure sensor device disclosed by U.S. Pat. No. 6,093,579. As shown in FIG. 1A, by a first lithography process, a region 104 is defined on a substrate 100 by a mask 102 and a mask 106, wherein the mask 102 covers the rest of the substrate 100 and the mask 106 has a specific pattern to define the pattern of the region 104. FIG. 1B is a schematic cross-section view showing the MEMS pressure sensor device after the first lithography process and a first etching process. As shown in FIG. 1B, after the first etching process, a membrane (the substrate) of the MEMS pressure sensor device includes a boss 108 with the specific pattern in the center area and deep trenches 110 around the boss 108, wherein the boss 108 has a thickness d. Next, as shown in FIG. 1C, a second lithography process is performed wherein the boss 108 is no longer covered by the mask 106, and a second etching process is applied to obtain a desired thickness of the membrane, wherein the thickness d of the boss 108 is relatively maintained. In the second etching process, the trapezoid boss 108 is rounded at edges as shown by the cross-section view in FIG. 1D. At last the mask 102 outside the region 104 is removed, such that a thinner membrane with the boss 108 is obtained as shown in FIG. 1E.

A membrane with the boss 108 and having a thinner thickness causes the MEMS pressure sensor device to have a relatively higher sensitivity and a relatively wider linear operation region. However, although this prior art can generate a MEMS pressure sensor device with such a membrane, it requires two lithography processes and the second lithography process must be aligned with the first lithography process. After the trenches 110 are formed, the topography of the substrate 100 is rugged and this is very disadvantageous to the second lithography process. The alignment may fail, and specific process and material maybe required. Therefore, this prior art needs relatively high manufacturing cost.

Besides, the second etching process is an anisotropic etching process. The boss 108 will be squared from a top view (not shown) after the anisotropic etching process; this is due to the characteristics of the anisotropic etching and the lattice of the substrate 100. Therefore, this prior art limits the shape of the boss 108 and therefore limits the design and application of the MEMS pressure sensor device.

In view of above, to overcome the drawbacks in the prior art, the present invention proposes a MEMS pressure sensor device and a manufacturing method thereof, which can sense a lower pressure with a lower manufacturing cost so as to provide wider applications.

SUMMARY OF THE INVENTION

The first objective of the present invention is to provide a MEMS pressure sensor device.

The second objective of the present invention is to provide a manufacturing method of MEMS pressure sensor device.

To achieve the objectives mentioned above, from one perspective, the present invention provides a MEMS pressure sensor device, including: a substrate having at least one recess formed on an upper surface thereof, the recess defining a boss; a membrane, which is bonded to at least a part of the upper surface of the substrate and at least apart of the boss, so that the at least one recess forms a cavity; at least one sensing unit, which is coupled to the membrane for sensing deflection of the membrane; and a first opening, which is formed on a lower surface of the substrate, and connects to the recess.

From another perspective, the present invention provides a manufacturing method of Micro-Electro-Mechanical System (MEMS) pressure sensor device, including: f forming at least one recess on an upper surface of a substrate, the at least one recess defining a boss; bonding a membrane to at least a part of the upper surface of the substrate and at least apart of the boss, so that the at least one recess forms a cavity; coupling at least one sensing unit to the membrane for sensing deflection of the membrane; and forming a first opening on a lower surface of the substrate by an etching process or a polishing process, and connecting the first opening to the cavity.

In one embodiment of the MEMS pressure sensor device, the first opening is preferably formed by a deep reactive ion etching (DRIE) process.

In another embodiment, the sensing unit preferably senses the deflection of the membrane and generates a resistance difference signal, a capacitance difference signal, or a voltage difference signal.

In yet another embodiment, the MEMS pressure sensor device preferably further includes a bonding glass, which is bonded to the lower surface of the substrate, and the bonding glass preferably includes a second opening which connects to the first opening.

In another embodiment, the bonding step preferably includes one of: a direct bonding process, an anodic bonding process, an eutectic bonding process, an adhesive bonding process, and a glass frit bonding process.

In the aforementioned MEMS pressure sensor device and the manufacturing method thereof, the boss has a thickness which is preferably adjusted by the etching process or the polishing process.

The aforementioned manufacturing method of the MEMS pressure sensor device preferably further includes: forming a stop layer between the cavity and the substrate, for stopping the etching process or the polishing process.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
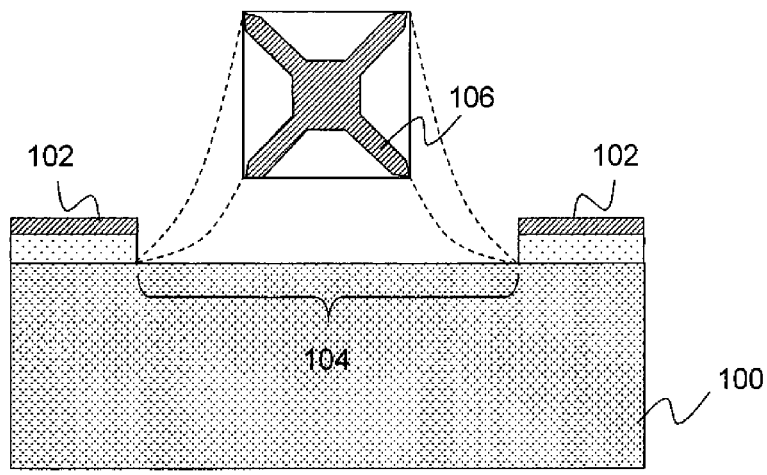
FIGS. 1A-1E show cross-section views of a manufacturing flow of a MEMS pressure sensor device disclosed by U.S. Pat. No. 6,093,579.
Figure 1B:
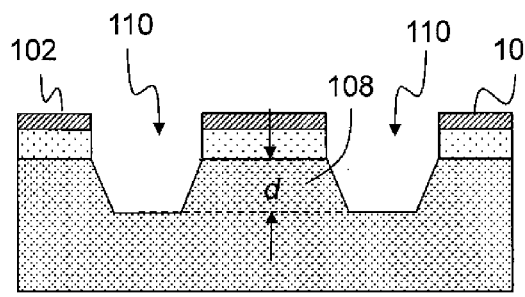
Figure 1C:
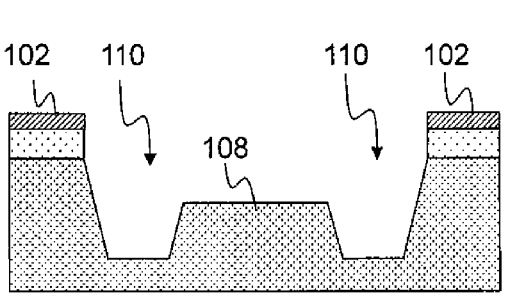
Figure 1D:
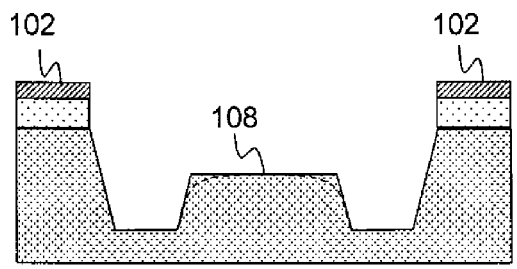
Figure 1E:
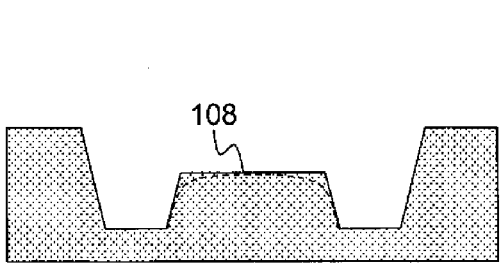
Figure 2A:
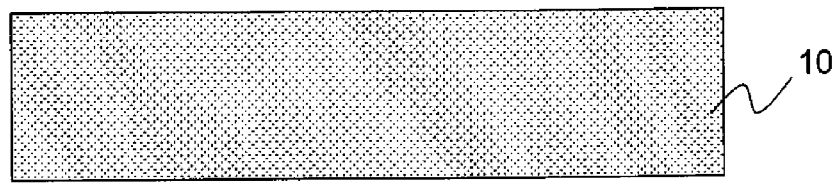
FIGS. 2A-2F show a first embodiment of the present invention.
Figure 2B:
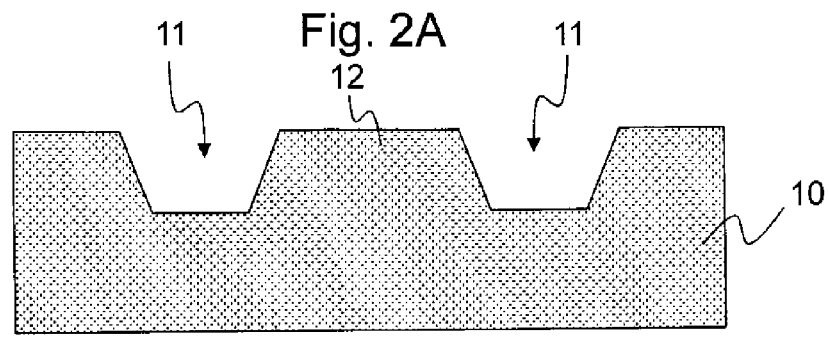
Figure 2C:
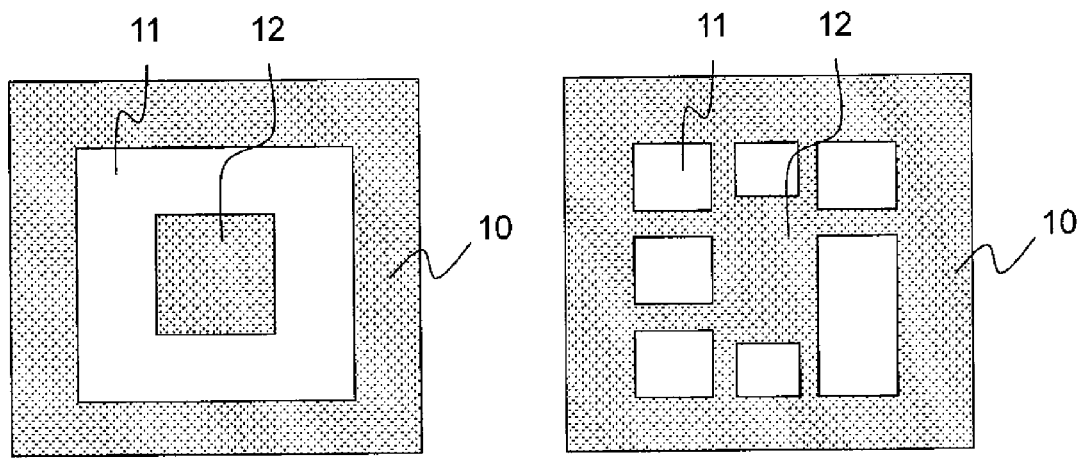
Figure 2D:
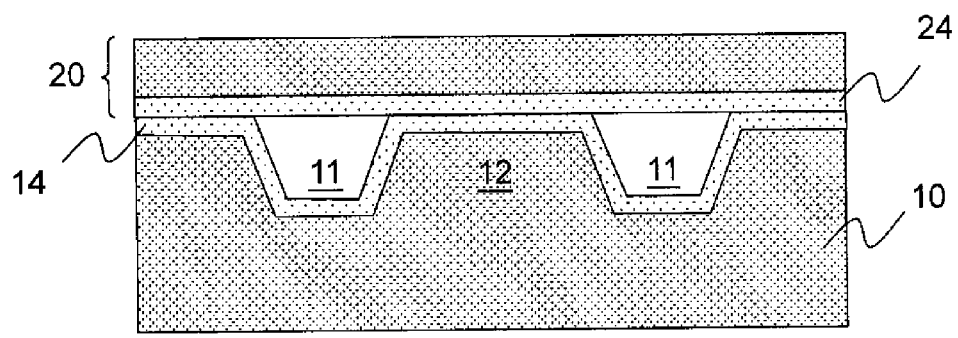
Figure 2E:
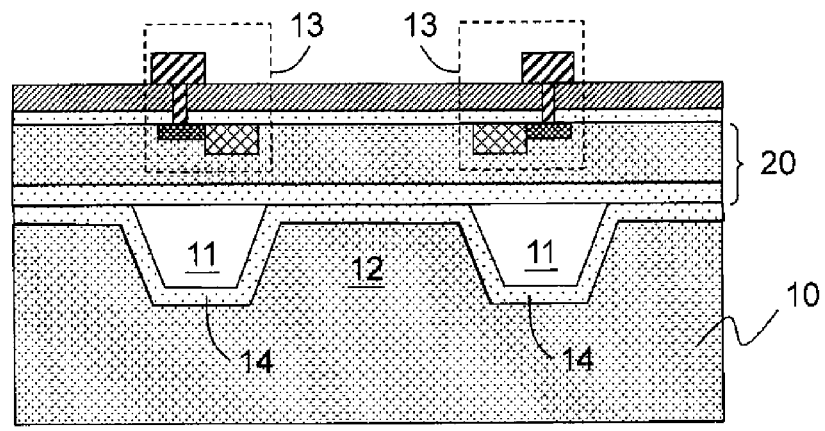

FIGS. 2A-2F show a first embodiment of the present invention. This embodiment shows an example of a MEMS pressure sensor device manufacturing flow of the present invention. FIGS. 2A-2B and 2D-2F are cross-section views, and FIG. 2C is a top view. Referring to FIG. 2A, a substrate 10 is provided first, and the substrate 10 is for example but not limited to a silicon substrate. Next, a recess/recesses 11 is/are formed and a boss 12 is defined inside/between the recess/recesses 11 by a lithography process and an etching process as shown in FIG. 2B. FIG. 2C for example shows two embodiments of the recess/recesses 11 from top views. The number of the recess/recesses 11 may be single or plural. The multiple recesses 11 may connect to each other or separate from each other, and they may be regular shape or irregular shape. If the recesses 11 are multiple, sizes of the recesses 11 maybe same or different, and the arrangement of the multiple recesses 11 may be regular or irregular as long as the boss 12 is defined by the arrangement of the multiple recesses 11. The boss 12 is used to increase the sensitivity of the MEMS pressure sensor device, and the shape and the location of the boss 12 are not limited. Referring to FIG. 2D, a membrane 20, for example but not limited to a silicon substrate with an oxide layer 24 on its surface, is bonded to an upper surface of the substrate 10. The recess/recesses 11 thus becomes/become one or more cavities 11. The upper surface of the substrate 10 for example may be an oxide layer 14, and the bonding method may be but not limited to: a direct bonding process, an anodic bonding process, an eutectic bonding process, an adhesive bonding process, or a glass frit bonding process. The process steps shown in FIGS. 2A-2D may be but not limited to a manufacturing method of cavity silicon on insulator (cavity SOI). FIG. 2E shows that an electronic unit, for example sensing units 13 and related wiring, is formed in the membrane 20. The electronic unit does not have to be formed in the membrane 20 and it may be formed outside the membrane 20, as long as it is coupled to the membrane 20 to sense the deflection of the membrane 20. The sensing units 13 maybe formed for example by a combination of selected ones of the followings: a lithography process, an etching process, a deposition process, a diffusion process, and an ion implantation process, etc.

Figure 2F:
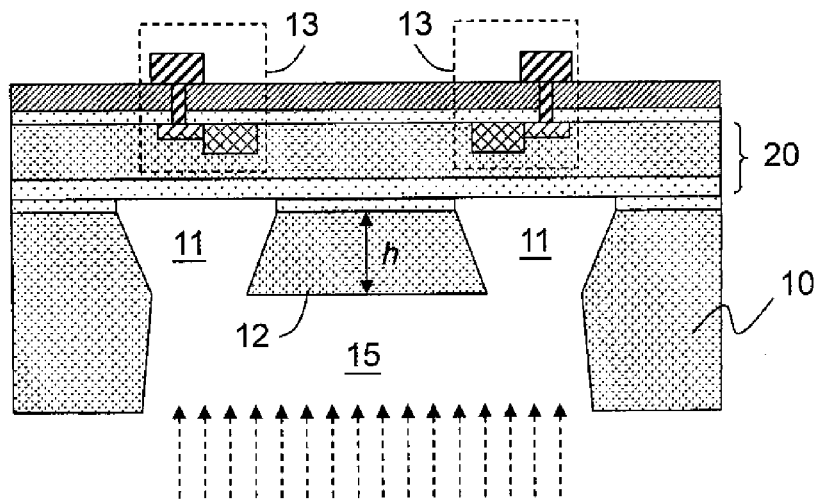

Referring to FIG. 2F, an opening 15 is formed on a lower surface of the substrate 10. The opening 15 is formed by for example but not limited to a deep reactive ion etching (DRIE) process, or a chemical mechanical polishing (CMP) process. Different from the prior art, the opening 15 is formed on the flat lower surface of the substrate 10 in this embodiment. Therefore, there is no misalignment problem as in the prior art, and no specific process or materials are required, so the manufacturing cost is decreased. This is one of the advantageous features of the present invention over the prior art. The opening 15 is connected to the cavity/cavities 11, such that the cavity/cavities 11 can sense pressure (that is, the pressure can exert on the membrane 20). The thickness h of the boss 12 may be adjusted by the etching process or the polishing process. Note that, referring to FIGS. 2E and 2F, the oxide layer 14 between the cavity 11 and the substrate 10 may be used as a stop layer for stopping the etching process or the polishing process which forms the opening 15.

Figure 3A:
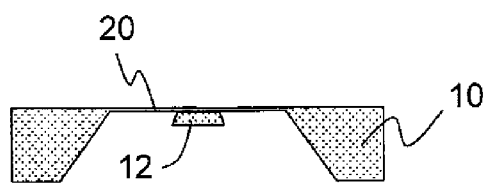
FIGS. 3A-3D are examples explaining how a resistance difference signal is generated by a sensing unit 13 according to piezoresistive sensing mechanism.
Figure 3B:
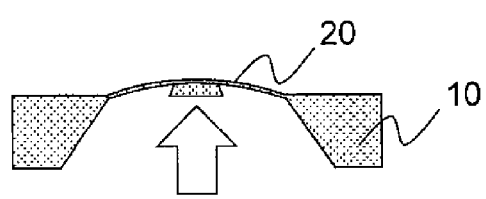
Figure 3C:
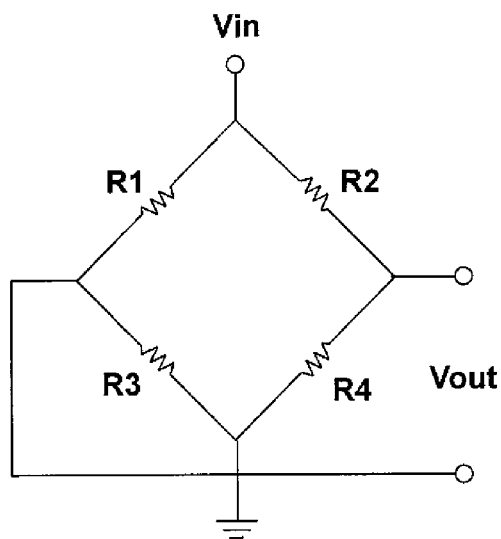
Figure 3D:
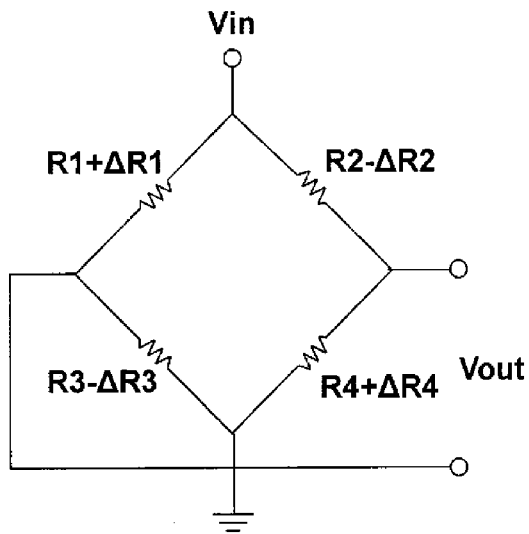

FIGS. 3A-3D are examples explaining how a resistance difference signal is generated by a sensing unit 13 according to piezoresistive sensing mechanism. As shown in FIG. 3A, when no pressure is applied to the membrane 20, the membrane 20 is flat as shown in the figure for example. As shown in FIG. 3B, when a pressure to be sensed is applied to the membrane 20, the membrane 20 will deflect with different degrees according to the sensed pressure (indicated by the arrow shown in the figure). The boss 12 increases the sensitivity of the membrane 20 to the sensed pressure. The sensing unit 13 for example may be a bridge circuit as shown in FIG. 3C, by arranging resistors R1, R2, R3, and R4 at proper positions in the device. When the membrane 20 is deflected because of the sensed pressure, resistances of the resistors in the sensing unit 13 change accordingly, for example $R1+\alpha R1$, $R2-\alpha R2$, $R3-\alpha R3$, and $R4+\alpha R4$ as shown in FIG. 3D. The pressure may be calculated from the changes in an output voltage Vout for a given input voltage Vin. Certainly, the sensing unit of the MEMS pressure sensor device of the present invention is not limited to operating according to the piezoresistive sensing mechanism. The MEMS pressure sensor device of the present invention can be applied to other types of applications such as for generating a capacitance difference signal by capacitive sensing mechanism, or for generating a voltage difference signal by piezoelectric sensing mechanism, etc.; i.e., the sensing unit 13 can be designed to sense the deflection of the membrane 20 and generate a resistance difference signal, a capacitance difference signal, or a voltage difference signal.

Figure 4:
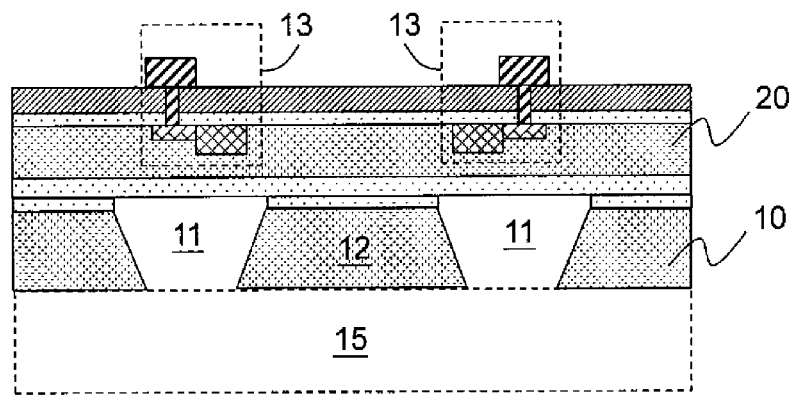
FIG. 4 shows a second embodiment of the present invention.

FIG. 4 shows a second embodiment of the present invention. This embodiment is different from the first embodiment in that, the opening 15 of this embodiment is for example formed by a CMP process, such that the lower surface of the substrate 10 is globally planarized.

Figure 5:
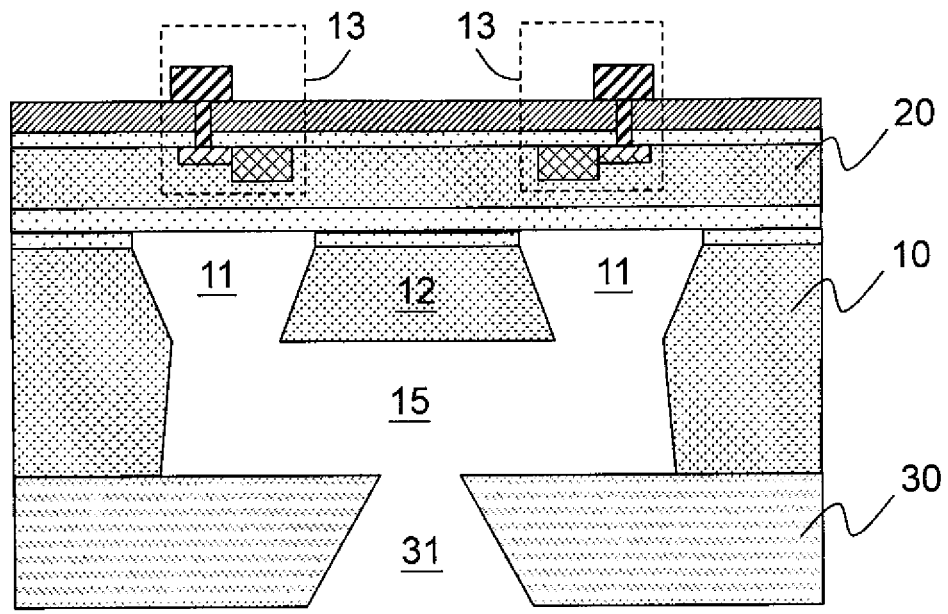
FIG. 5 shows a third embodiment of the present invention.
Figure 6:
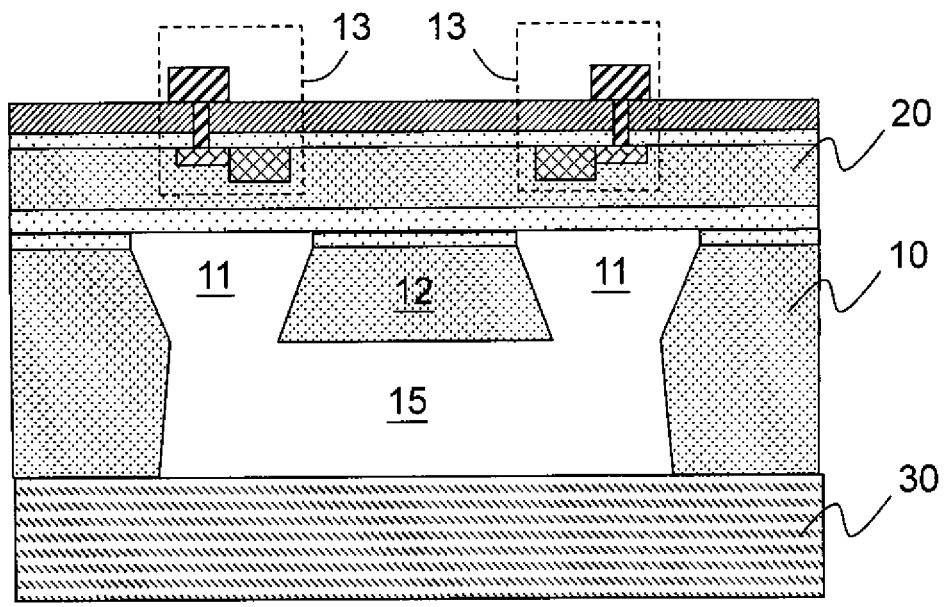
FIG. 6 shows that the bonding glass 30 may include no opening to form an absolute pressure sensor device.

FIG. 5 shows a third embodiment of the present invention. This embodiment is different from the first embodiment in that the MEMS pressure sensor device further includes a bonding glass 30. The bonding glass 30 is bonded to the lower surface of the substrate 10. The bonding glass 30 includes an opening 31, which is connected to the opening 15, such that the cavities 11 can sense pressure to form a relative pressure sensor. FIG. 6 shows an embodiment which includes the bonding glass 30 without opening to form an absolute pressure sensor device.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the opening 15 may be formed by a combination of two or more processes, not limited to only one of the etching process and the polishing process. For another example, the substrate 10 and the membrane 20 are not limited to the silicon substrate, but instead may be other types of substrates such as semiconductor substrates, metal substrates, or insulator substrates. For yet another example, the stop layer is not limited to the oxide layer 15 as shown in the embodiments, but may be a nitride layer or other types of stop layers made of other materials which can stop the etching process or the polishing layer. For yet another example, the shapes of the structural parts of the present invention are not limited to those shown in the embodiments, but they may be changed; such as, the shape of the boss 12 is not limited to a square, etc. In view of the foregoing, the spirit of the present invention should cover all such and other modifications and variations, which should be interpreted to fall within the scope of the following claims and their equivalents.

What is claimed is:
1. A micro-electro-mechanical system (MEMS) pressure sensor device, comprising:
    a substrate having at least one recess formed on an upper surface thereof, the recess defining a boss;

a membrane, which is bonded to at least a part of the upper surface of the substrate and at least a part of the boss, so that the at least one recess forms a cavity;

at least one sensing unit, which is coupled to the membrane for sensing deflection of the membrane; and a first opening, which is formed on a lower surface of the substrate, and connects to the cavity.

2. The MEMS pressure sensor device of claim 1, further comprising an etching stop layer between the membrane and the upper surface of the substrate, which is resistant to an etchant for etching the substrate.

3. The MEMS pressure sensor device of claim 1, wherein the sensing unit senses the deflection of the membrane and generates a resistance difference signal, a capacitance difference signal, or a voltage difference signal.

4. The MEMS pressure sensor device of claim 1, further comprising a bonding glass, which is bonded to the lower surface of the substrate.

5. The MEMS pressure sensor device of claim 4, wherein the bonding glass includes a second opening, which connects to the first opening.

6. The MEMS pressure sensor device of claim 1, wherein the membrane is bonded to at least a part of the substrate by one of: a direct bonding process, an anodic bonding process, an eutectic bonding process, an adhesive bonding process, and a glass frit bonding process.

7. A manufacturing method of Micro-Electro-Mechanical System (MEMS) pressure sensor device, comprising:

forming at least one recess on an upper surface of a substrate, the at least one recess defining a boss;

bonding a membrane to at least a part of the upper surface of the substrate and at least a part of the boss, so that the at least one recess forms a cavity;

coupling at least one sensing unit to the membrane for sensing deflection of the membrane; and forming a first opening on a lower surface of the substrate by an etching process or a polishing process, and connecting the first opening to the cavity.

8. The manufacturing method of claim 7, wherein the etching process includes a deep reactive ion etch (DRIE) process.

9. The manufacturing method of claim 7, wherein the sensing unit senses the deflection of the membrane and generates a resistance difference signal, a capacitance difference signal, or a voltage difference signal.

10. The manufacturing method of claim 7, further comprising:

bonding a bonding glass to the lower surface of the substrate.

11. The manufacturing method of claim 10, further comprising:

forming a second opening in the bonding glass, which is connected to the first opening.

12. The manufacturing method of claim 7, wherein the bonding step includes one of: a direct bonding process, an anodic bonding process, an eutectic bonding process, an adhesive bonding process, and a glass frit bonding process.

13. The manufacturing method of claim 7, wherein the etching process or the polishing process adjusts a thickness of the boss.

14. The manufacturing method of claim 7, further comprising forming a stop layer between the recess and the substrate as a process stop layer of the etching process or the polishing process.

* * * * *